United States Patent
Zhang et al.

(10) Patent No.: US 12,484,167 B2
(45) Date of Patent: Nov. 25, 2025

(54) CORNER PROTECTION DEVICE FOR A DISPLAY SCREEN AND DISPLAY SCREEN ASSEMBLY

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhengqiang Li, Guangdong (CN); Guanyu Lai, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/291,917

(22) PCT Filed: Nov. 30, 2023

(86) PCT No.: PCT/CN2023/135407
§ 371 (c)(1),
(2) Date: Jan. 24, 2024

(87) PCT Pub. No.: WO2024/120295
PCT Pub. Date: Jun. 13, 2024

(65) Prior Publication Data
US 2025/0107024 A1    Mar. 27, 2025

(30) Foreign Application Priority Data

Dec. 5, 2022 (CN) .......................... 202211549406.6

(51) Int. Cl.
*H05K 5/00* (2025.01)
*H05K 5/02* (2006.01)
(Continued)

(52) U.S. Cl.
CPC ....... *H05K 5/0221* (2013.01); *H10H 29/8506* (2025.01); *H01L 25/0753* (2013.01); *H10H 29/24* (2025.01)

(58) Field of Classification Search
CPC ............... H05K 5/0221; H05K 5/0217; H10H 29/8506; H10H 29/24; H01L 25/0753;
(Continued)

(56) References Cited

U.S. PATENT DOCUMENTS 7,907,394 B2 * 3/2011 Richardson ........... G06F 1/1613
361/679.02
8,775,710 B1 * 7/2014 Miller ................... G06F 1/1632
361/679.19

(Continued)

FOREIGN PATENT DOCUMENTS

CN     110751911 A * 2/2020 ............... G09F 9/33

*Primary Examiner* — Rockshana D Chowdhury

(57) ABSTRACT

The present disclosure discloses a corner protection device for a display screen and a display screen assembly. In the corner protection device, when a locking member slides on a base to be in a locked state, a locking block is inserted into a locking slot, a first protrusion is inserted into a first through hole of a first corner protection plate, and a second protrusion is inserted into a second through hole of a second corner protection plate. The first corner protection plate and the second corner protection plate protrude from a corner of the display screen. When the locking member slides on the base to be in an unlocked state, the first protrusion or the second protrusion drives the locking block to disengage from the locking slot, and the first corner protection plate and the second corner protection plate are received in a corner of the display screen.

17 Claims, 5 Drawing Sheets

(51) Int. Cl.
*H10H 29/85* (2025.01)
*H01L 25/075* (2006.01)
*H10H 29/24* (2025.01)

(58) Field of Classification Search
CPC ....... B65D 81/054; G06F 1/1637; G09F 9/30; G09F 9/33
See application file for complete search history.

(56) References Cited

U.S. PATENT DOCUMENTS

| | | | | |
|---|---|---|---|---|
| 8,823,898 B2* | 9/2014 | Paleczny | ............. | H04M 1/0266 349/58 |
| 8,885,337 B2* | 11/2014 | Schanz | ................. | B62J 50/225 248/229.11 |
| 10,216,222 B2* | 2/2019 | Fenton | ..................... | A45F 5/00 |
| 10,341,476 B2* | 7/2019 | Lin | ....................... | G06F 1/1686 |
| 10,349,714 B2* | 7/2019 | Kapinos | ................. | A45C 13/00 |
| 10,884,453 B2* | 1/2021 | Armstrong | ............. | A45C 11/00 |
| 10,966,496 B2* | 4/2021 | Richardson | .......... | H05K 5/0086 |
| 11,320,857 B2* | 5/2022 | Turner | ................. | G06F 1/1616 |
| 11,693,269 B2* | 7/2023 | Noh | .................. | G02F 1/133305 349/56 |
| 11,934,231 B2* | 3/2024 | Dunbar | ................ | G06F 1/1656 |
| 12,090,738 B2* | 9/2024 | Zhang | .................... | B32B 3/266 |
| 2002/0056656 A1* | 5/2002 | Beliveau | ............... | B65D 81/054 206/453 |
| 2002/0144923 A1* | 10/2002 | Baechle | ............... | B65D 81/054 428/36.9 |
| 2002/0189969 A1* | 12/2002 | Renck | .................. | B65D 81/054 206/453 |
| 2008/0259551 A1* | 10/2008 | Gavenda | ............. | G06F 1/1656 361/728 |
| 2012/0154997 A1* | 6/2012 | Shi | ........................ | G06F 1/1656 361/679.01 |
| 2015/0301565 A1* | 10/2015 | Manullang | ............ | G06F 1/1626 361/679.26 |
| 2017/0047134 A1* | 2/2017 | Collin | .................... | B65D 85/70 |
| 2018/0054903 A1* | 2/2018 | Yamamoto | ............ | G06F 1/1637 |
| 2019/0315104 A1* | 10/2019 | Han | ....................... | B32B 27/32 |
| 2020/0194870 A1* | 6/2020 | Yamamoto | ............ | G06F 1/1656 |
| 2023/0026482 A1* | 1/2023 | Wang | .................... | G06F 1/1652 |
| 2024/0036610 A1* | 2/2024 | Perelli | .................. | G06F 1/1616 |

* cited by examiner

CORNER PROTECTION DEVICE FOR A DISPLAY SCREEN AND DISPLAY SCREEN ASSEMBLY

The present disclosure claims priority to the Chinese patent application NO. 202211549406.6, entitled "CORNER PROTECTION DEVICE FOR A DISPLAY SCREEN AND DISPLAY SCREEN ASSEMBLY", filed on Dec. 5, 2022, the entire contents of which are incorporated herein by reference.

TECHNICAL FIELD

The present disclosure relates to the technical field of display screens, and in particular relates to a corner protection device for a display screen and a display screen assembly.

BACKGROUND

Light emitting diode (LED) display screens are widely used in many fields. Usually, the display screen includes a frame and a display module mounted on the frame for displaying images. During the transportation of the display screen, corners of the display screen are prone to collide with external objects. Since the display module is fragile, in order to avoid accidents that damage the display module, it is usually necessary to install a corner protection device at each corner of the display screen.

A large-sized display screen is usually made up of multiple small display screens assembled together; the inventor realized that, the corner protection devices installed on the small display screens need to be removed before the small display screens are assembled, which not only reduces the assembly efficiency of the display screens, but also increases the assembly cost of the display screens.

SUMMARY OF THE DISCLOSURE

The present disclosure provides a corner protection device for a display screen and a display screen assembly, aiming to solve the technical problem in the prior art that the corner protection device needs to be removed before the assembly of the display screen.

In view of the above technical problems, the present disclosure provides a corner protection device for a display screen. The corner protection device includes a corner protector, a base, and a locking member; the corner protector includes a first corner protection plate and a second corner protection plate connected to the first corner protection plate, a first through hole is defined in the first corner protection plate, and a second through hole is defined in the second corner protection plate; a locking slot is formed in the corner protector, a first protrusion, a second protrusion, and a locking block are arranged on the locking member; the corner protector and the locking member are both slidably mounted on the base, and the locking member is configured to lock the corner protector on the base;

when the locking member slides on the base to be in a locked state, the locking block is inserted into the locking slot, the first protrusion is inserted into the first through hole, the second protrusion is inserted into the second through hole, and the first corner protection plate and the second corner protection plate protrude from a corner of the display screen;

when the locking member slides on the base to be in an unlocked state, the first protrusion or the second protrusion drives the locking block to disengage from the locking slot, and the first corner protection plate and the second corner protection plate are received in the corner of the display screen.

The present disclosure further provides a display screen assembly, including a display module, a frame, and a corner protection device, wherein the corner protection device includes a corner protector, a base, and a locking member; the corner protector includes a first corner protection plate and a second corner protection plate connected to the first corner protection plate, a first through hole is defined in the first corner protection plate, and a second through hole is defined in the second corner protection plate; a locking slot is formed in the corner protector, a first protrusion, a second protrusion, and a locking block are arranged on the locking member; the corner protector and the locking member are both slidably mounted on the base, and the locking member is configured to lock the corner protector on the base;

when the locking member slides on the base to be in a locked state, the locking block is inserted into the locking slot, the first protrusion is inserted into the first through hole, the second protrusion is inserted into the second through hole, and the first corner protection plate and the second corner protection plate protrude from a corner of the display screen;

when the locking member slides on the base to be in an unlocked state, the first protrusion or the second protrusion drives the locking block to disengage from the locking slot, and the first corner protection plate and the second corner protection plate are received in the corner of the display screen;

the display module is mounted on the frame, and the base is mounted at each corner of the frame;

when the locking member is in the locked state, the first corner protection plate and the second corner protection plate protrude from two adjacent sides of the display module;

when the locking member is in the unlocked state, the first corner protection plate and the second corner protection plate are received in the frame.

In the present disclosure, when the locking member is in the locked state, the first corner protection plate and the second corner protection plate protrude from two adjacent sides of the display module of the display screen, that is, the first corner protection plate and the second corner protection plate can protect the corners of the display module of the display screen in the XY plane. Furthermore, the first corner protection plate and the second corner protection plate protrude above the display module of the display screen, such that the first corner protection plate and the second corner protection plate can protect the display module of the display screen in the Z direction.

When two adjacent display screens are assembled, the first protrusion drives the locking member to slide on the base, the locking block disengages from the locking slot such that the locking block is released from the locking slot, which allows the corner protector to slide on the base until the corner protector moves below the display module of the display screen, thus, the two adjacent display modules can be seamlessly assembled. In the present disclosure, the assembly of two adjacent display screens can be completed without removing the corner protection device from the display screen, which improves the assembly efficiency of the display screens and reduces the assembly cost of the display screens. In addition, the corner protection device has a simple structure and low manufacturing cost.

The details of one or more embodiments of the present application are presented in the following figures and description, and other features and advantages of the present application will become apparent from the description, figures, and claims.

BRIEF DESCRIPTION OF THE DRAWINGS

The following further explains the present application in combination with the accompanying drawings and embodiments.

Figure 1:
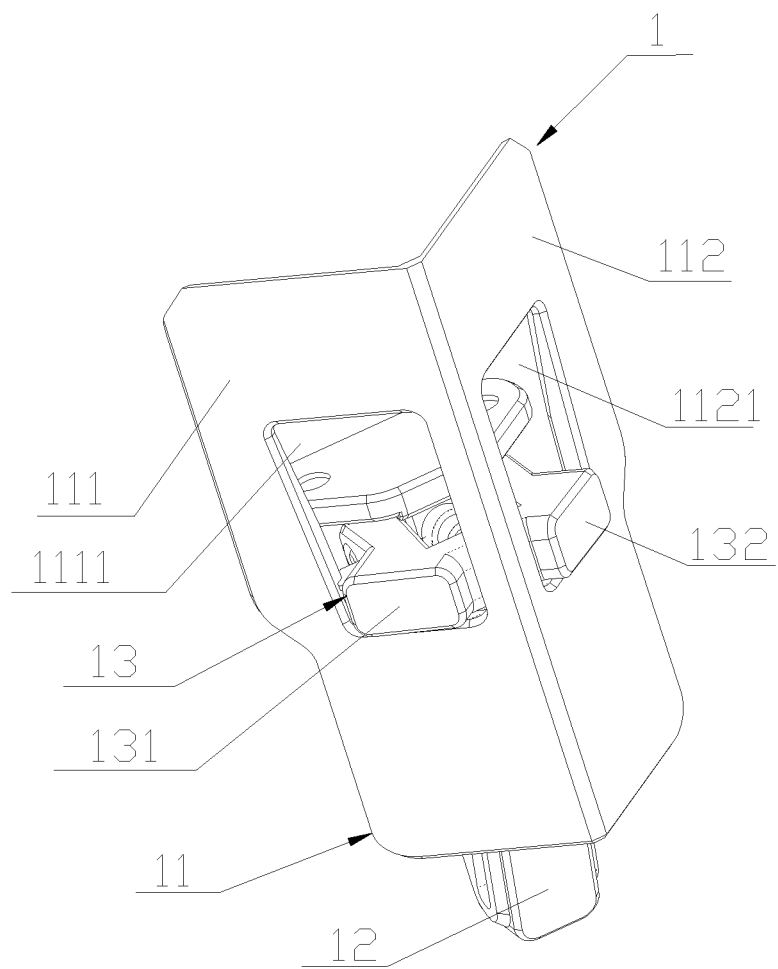
FIG. 1 is a structural diagram of a corner protection device for a display screen in accordance with an embodiment of the present disclosure.

The reference numbers in the description are as follows:

1, corner protection device; 11, corner protector; 111, first corner protection plate; 1111, first through hole; 1112, first mounting block; 112, second corner protection plate; 1121, second through hole; 1122, second mounting block; 113, locking slot; 114, second sliding rod; 12, base; 121, first sliding hole; 122, second sliding hole; 13, locking member; 131, first protrusion; 132, second protrusion; 133, locking block; 134, first sliding rod; 14, first elastic member; 15, second elastic member; 2, display module; 3, frame; 31, receiving groove.

PREFERRED EMBODIMENTS

In the following, the technical solutions in the embodiments of the present disclosure will be clearly and completely described with reference to the drawings in the embodiments of the present disclosure.

It should be understood that the terms "up", "down", "left", "right", "front", "rear", "middle" and other directional or positional relationships indicated are based on the directional or positional relationships shown in the drawings, and are only for the convenience of describing the present application and simplifying the description, rather than indicating or implying that the devices or elements referred to must have a specific orientation, be constructed and operated in a specific orientation, and therefore cannot be understood as limitations of the present application.

As shown in FIG. 1 to FIG. 5, an embodiment of the present disclosure provides a corner protection device 1 for a display screen, which includes a corner protector 11, a base 12, and a locking member 13. The corner protector 11 includes a first corner protection plate 111 and a second corner protection plate 112 connected to the first corner protection plate 111. A first through hole 1111 is defined in the first corner protection plate 111, and a second through hole 1121 is defined in the second corner protection plate 112. A locking slot 113 is formed in the corner protector 11. A first protrusion 131, a second protrusion 132, and a locking block 133 are arranged on the locking member 13. The corner protector 11 and the locking member 13 are both slidably mounted on the base 12, and the locking member 13 is configured to lock the corner protector 11 on the base 12. It can be understood that the first corner protection plate 111 and the second corner protection plate 112 can protect two adjacent sides of the display screen (that is, the first corner protection plate 111 and the second corner protection plate 112 can protect a corresponding corner of the display screen). An included angle between the first corner protection plate 111 and the second corner protection plate 112 can be designed according to actual needs. In an embodiment, the included angle between the first corner protection plate 111 and the second corner protection plate 112 is 90 degrees.

When the locking member 13 slides on the base 12 to be in a locked state, the locking block 133 is inserted into the locking slot 113, the first protrusion 131 is inserted into the first through hole 1111, and the second protrusion 132 is inserted into the second through hole 1121. The first corner protection plate 111 and the second corner protection plate 112 protrude from the corner of the display screen. It can be understood that when the locking block 133 is inserted into the locking slot 113, the locking member 13 is in the locked state. At this time, the corner protector 11 cannot slide on the base 12, the first protrusion 131 passes through the through hole 1111 to be exposed outside the first corner protection plate 111, and the second protrusion 132 passes through the second through hole 1121 to be exposed outside the second corner protection plate 112. The first corner protection plate 111 is located outside a first side of the display screen, and the second corner protection plate 112 is located outside a second side of the display screen. The first side and the second side are adjacent sides of the display screen, such that the corner protector 11 can protect the corresponding corner of the display screen (that is, the first corner protection plate 111 and the second corner protection plate 112 can protect the display screen in a XY plane). Furthermore, an upper end of the first corner protection plate 111 and an upper end of the second corner protection plate 112 protrude above the display screen, such that the first corner protection plate 111 and the second corner protection plate 112 can protect the display screen in a Z direction.

When the locking member 13 slides on the base 12 to be in an unlocked state, the first protrusion 131 or the second protrusion 132 drives the locking block 133 to disengage from the locking slot 113, and the first corner protection plate 111 and the second corner protection plate 112 are received in the corner of the display screen. It can be understood that after the locking block 133 disengages from the locking slot 113, the corner protector 11 is released from the locking member 13, and the corner protector 11 slides on the base 12 until the first corner protection plate 111 and the second corner protection plate 112 move below a display module 2 of the display screen, thus completing the assembly of two adjacent display screens.

Figure 7:
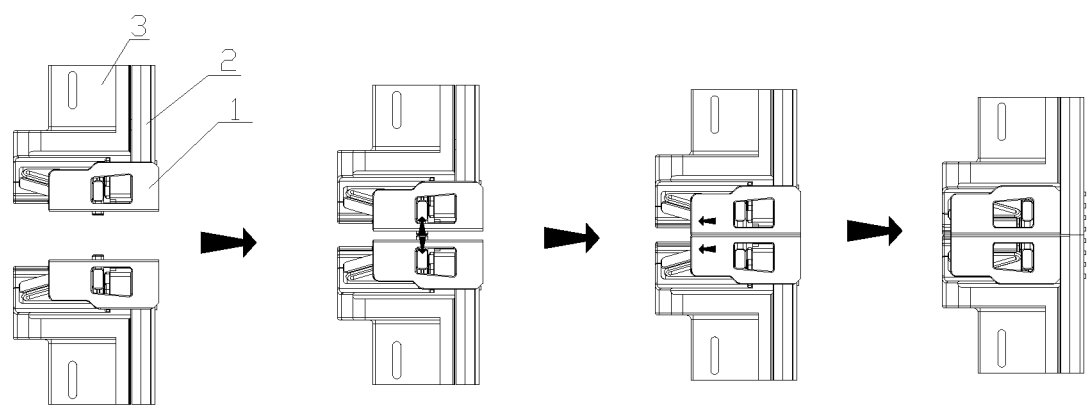
FIG. 7 is a flow diagram of assembling two display screens in accordance with an embodiment of the present disclosure.

In an embodiment, as shown in FIG. 7, when a first display screen and a second display screen are assembled (that is, when the two display screens are assembled), the corner protection device 1 is installed at each corner of the first display screen and the second display screen. The first protrusion 131 on the first display screen and the second protrusion 132 on the second display screen abut against each other, and drive the locking member 13 to slide on the base 12. The locking block 133 disengages from the locking slot 113, and the locking member 13 transitions from the locked state to the unlocked state. The corner protector 11 thus slides on the base 12 until the corner protector 11 moves below the display module 2 of the display screen (that is, the corner protector 11 is received in a corner of a frame 3 of the display screen).

In the present disclosure, when the locking member 13 is in the locked state, the first corner protection plate 111 and the second corner protection plate 112 protrude from two adjacent sides of the display module 2 of the display screen, that is, the first corner protection plate 111 and the second corner protection plate 112 can protect the corners of the display module 2 of the display screen in the XY plane. Furthermore, the first corner protection plate 111 and the second corner protection plate 112 protrude above the display module 2 of the display screen, such that the first corner protection plate 111 and the second corner protection plate 112 can protect the display module 2 of the display screen in the Z direction.

When two adjacent display screens are assembled, the first protrusion 131 drives the locking member 13 to slide on the base 12, the locking block 133 disengages from the locking slot 113 such that the locking block 133 is released from the locking slot 113, which allows the corner protector 11 to slide on the base 12 until the corner protector 11 moves below the display module 2 of the display screen, thus, the two adjacent display modules 2 can be seamlessly assembled. In the present disclosure, the assembly of two adjacent display screens can be completed without removing the corner protection device 1 from the display screen, which improves the assembly efficiency of the display screens and reduces the assembly cost of the display screens. In addition, the corner protection device 1 has a simple structure and low manufacturing cost.

Figure 2:
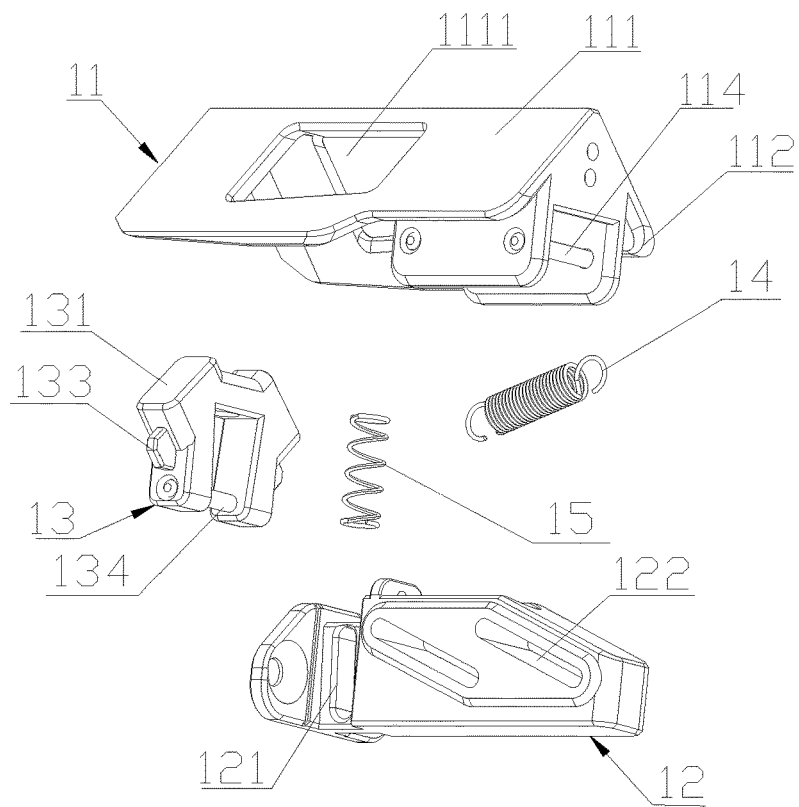
FIG. 2 is an exploded structural diagram of the corner protection device in accordance with an embodiment of the present disclosure.

In one embodiment, as shown in FIG. 1 and FIG. 2, the corner protection device 1 further includes a first elastic member 14 connected between the corner protector 11 and the base 12. When the locking member 13 transitions from the unlocked state to the locked state, the first elastic member 14 is configured to drive the locking member 13 to slide on the base 12 until the locking block 133 is inserted in the locking slot 113. It can be understood that the first elastic member 14 includes, but is not limited to, a spring, an elastic sheet, and a tension spring. In an embodiment, during the process in which the locking member 13 slides on the base 12 (i.e., during the process of transitioning the locking member 13 from the unlocked state to the locked state), a pulling force from the first elastic member 14 drives the corner protector 11 to slide upwards on the base 12 until the first corner protection plate 111 and the second corner protection plate 112 protrude from the adjacent sides of the display module 2 of the display screen. In this embodiment, during the process in which the locking member 13 transitions from the unlocked state to the locked state, the first elastic member 14 automatically drives the corner protector 11 to move upwards.

In an embodiment, as shown in FIG. 1, the corner protection device 1 also includes a second elastic member 15 connected between the locking member 13 and the base 12. The second elastic member 15 is configured to drive the locking member 13 to slide on the base 12, such that the locking member 13 transforms from the unlocked state to the locked state. It can be understood that the second elastic member 15 includes, but is not limited to, a spring, an elastic sheet, and a tension spring. In an embodiment, without applying any pushing force to the first protrusion 131 or the second protrusion 132, a pulling force from the second elastic member 15 is applied to the locking member 13, enabling the locking member 13 to slide on the base 12 until the locking block 133 is inserted into the locking slot 113, the first protrusion 131 is inserted into the first through hole 1111, and the second protrusion 132 is inserted into the second through hole 1121. At this time, the locking member 13 transitions from the unlocked state to the locked state. In this embodiment, the second elastic member 15 enables the locking member 13 to automatically transition from the unlocked state to the locked state without applying any pushing force to the first protrusion 131 or the second protrusion 132.

Furthermore, the second elastic member 15 enables the first protrusion 131 or the second protrusion 132 to slide on the base 12 under the pulling force from the second elastic member 15 until the locking member 133 is inserted into the locking slot, the first protrusion 131 is inserted into the first through hole 1111, and the second protrusion 132 is inserted into the second through hole 1121. During the process in which the locking member 13 slides on the base 12, the pulling force from the first elastic member 14 drives the corner protector 11 to slide on the base 12 until the first corner protection plate 111 and the second corner protection plate 112 protrude from the two adjacent sides of the display module 2 of the display screen. In the present disclosure, without applying any pushing force to the first protrusion 131 or the second protrusion 132, the first elastic member 14 and the second elastic member 15 can enable the locking member 13 to automatically slide to be in the locked state and the corner protector 11 to automatically slide to a corner protection state, such that the corner protection device 1 can automatically change into the corner protection state without manually toggling the corner protector 11 or the locking member 13 (that is, before the two adjacent display screens are assembled, the corner protector 11 keeps in a state of protecting the display module 2 of the display screen), which eliminates the error of manual operation and the invalid protection time of the corner protector 11, and improves the safety and reliability of the corner protection device 1.

In one embodiment, as shown in FIG. 1, a first sliding hole 121 is defined in the base 12, a first sliding rod 134 is arranged on the locking member 13, and a first sliding hole 121 is defined in the base 12. The locking member 13 is slidably mounted on the base 12 through the first sliding rod 134 which is inserted into the first sliding hole 121. It can be understood that the first sliding hole 121 is an elongated through hole, and when the locking member 13 slides on the base 12, the first sliding rod 134 slides in the first sliding hole 121. In this embodiment, the first sliding rod 134 slides in the first sliding hole 121, thus, the locking member 13 is limited to slide in the XY plane, ensuring the stability of the locking member 13 sliding on the base 12.

In one embodiment, as shown in FIG. 1, a second sliding hole 122 is defined in the base 12, and a second sliding rod 114 is arranged on the corner protector 11. The corner protector 11 is slidably mounted on the base 12 through the second sliding rod 114 which is inserted into the second sliding hole 122. It can be understood that the second sliding hole 122 is an elongated through hole, and when the corner protector 11 slides on the base 12, the second sliding rod 114 slides in the second sliding hole 122. In this embodiment, the second sliding rod 114 slides in the second sliding hole 122, thus, a sliding direction of the corner protector 11 on the base 12 is limited, ensuring the stability of the corner protector 11 sliding on the base 12.

Figure 4:
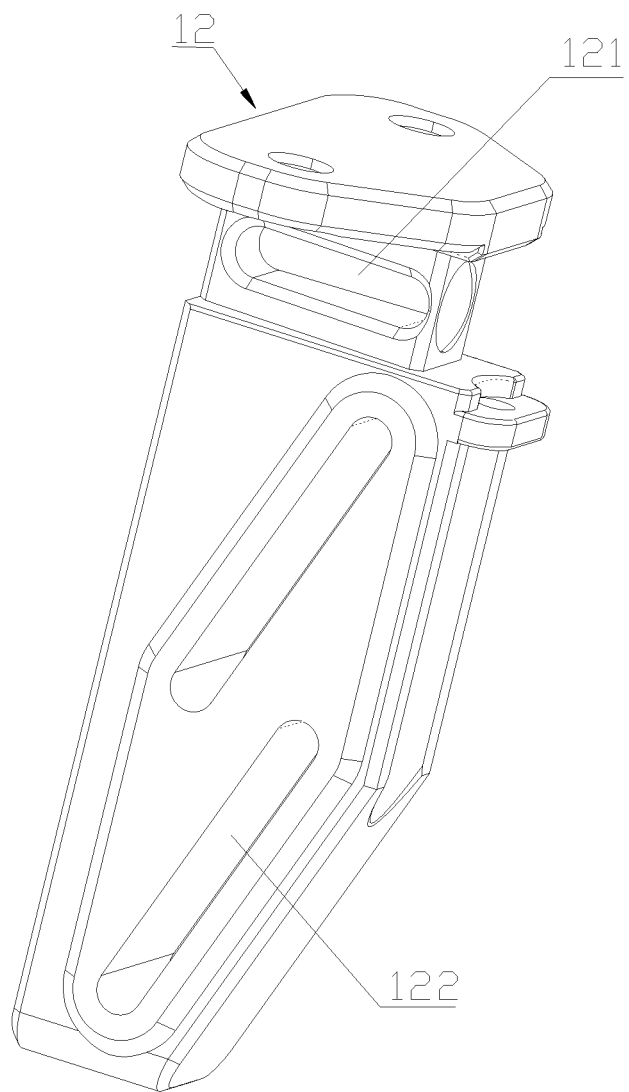
FIG. 4 is a structural diagram of a base of the corner protection device in accordance with an embodiment of the present disclosure.

In one embodiment, as shown in FIG. 4, the second sliding hole 122 is an inclined through hole, and a center line of the first sliding hole 121 and a center line of the second sliding hole 122 from an acute angle. It can be understood that the center line of the first sliding hole 121 is in the XY plane, and the center line of the second sliding hole 122 and the XY plane from an acute angle. In an embodiment, when the locking member 13 transitions from the locked state to the unlocked state, the corner protector 11 moves downwards on the base 12 until the corner protector 11 is received in the frame 3 of the display screen, that is, a plane where the first corner protection plate 111 is located is located inside the first side of the display module 2 of the display screen, and a plane where the second corner protection plate 112 is located is located inside the second side of the display module 2 of the display screen, thus the situation that the corner protector 11 hinders the assembly of two adjacent display screens can be avoided.

Figure 3:
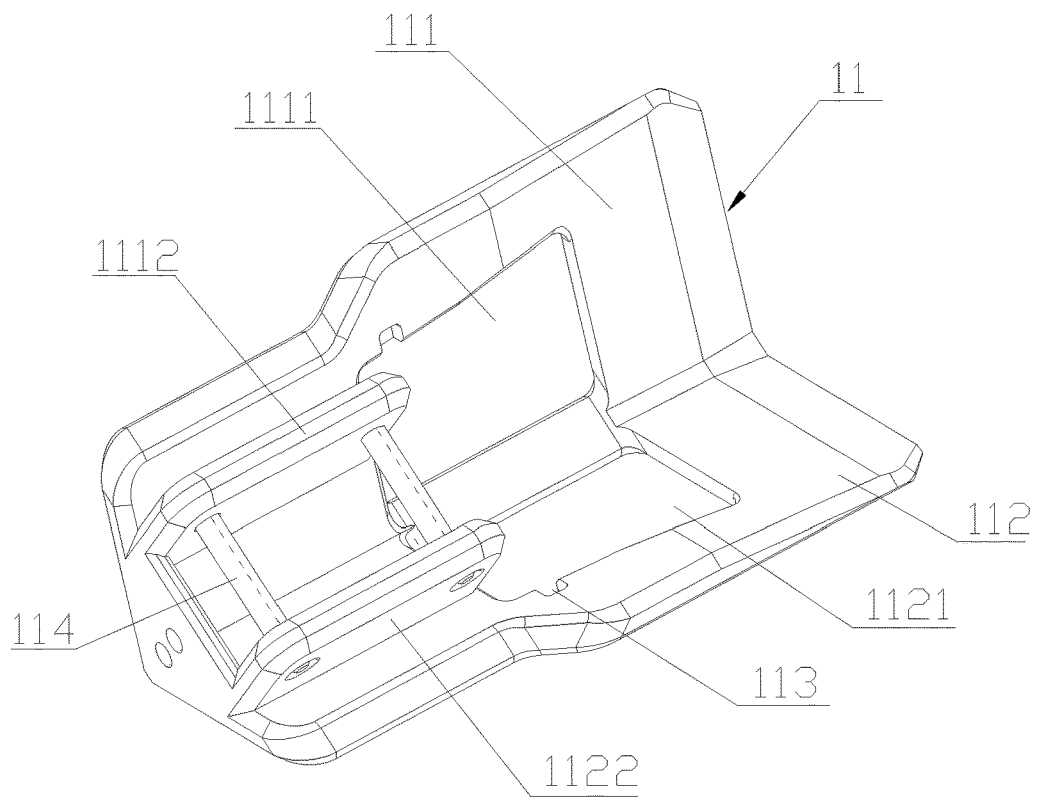
FIG. 3 is a structural diagram of a corner protector of the corner protection device in accordance with an embodiment of the present disclosure.

In one embodiment, as shown in FIG. 3, a first mounting block 1112 is arranged on the first corner protection plate 111, a second mounting block 1122 is arranged on the second corner protection plate 112, a sliding groove is formed between the first mounting block 1112 and the second mounting block 1122, and the second sliding rod 114 is arranged between the first mounting block 1112 and the second mounting block 1122. A sliding portion is arranged on the base 12, the second sliding hole 122 is defined in the sliding portion, and the sliding portion is inserted into the sliding groove. It can be understood that the first mounting block 1112 is arranged on an inner side of the first corner protection plate 111, the second mounting block 1122 is arranged on an inner side of the second corner protection plate 112, the second sliding rod 114 passes through the sliding groove, and opposite ends of the second sliding rod 114 are respectively connected to the first mounting block 1112 and the second mounting block 1122. In this embodiment, the corner protection device 1 has a compact structure and a high stability.

Figure 5:
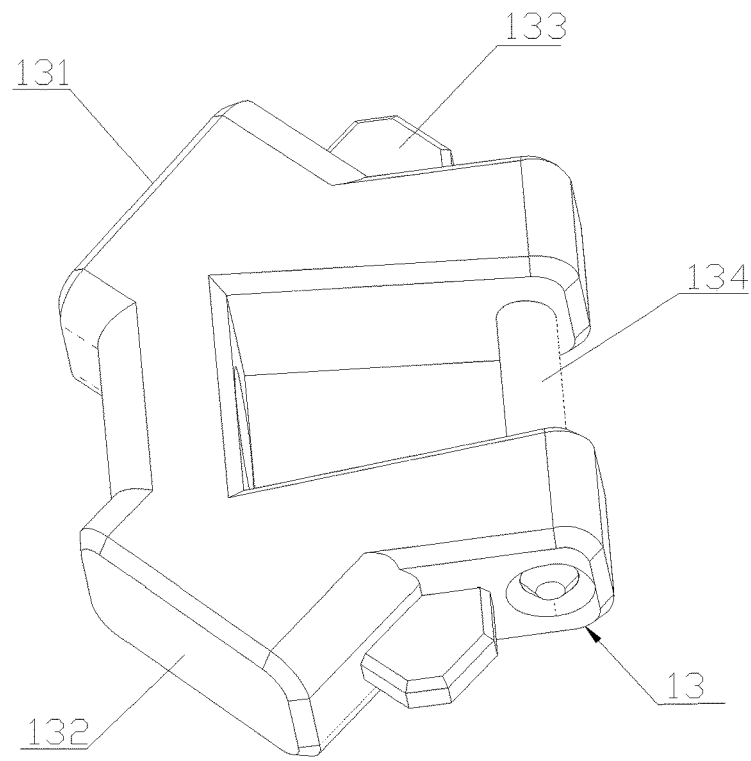
FIG. 5 is a structural diagram of a locking member of the corner protection device in accordance with an embodiment of the present disclosure.

In one embodiment, as shown in FIG. 3 and FIG. 5, the locking slot 113 includes a first locking slot formed in the first corner protection plate 111 and a second locking slot formed in the second corner protection plate 112. The locking block 133 includes a first locking block arranged on the first protrusion 131 and a second locking block arranged on the second protrusion 132. It can be understood that the first locking slot is formed in the inner side of the first corner protection plate 111 and the second locking slot is formed in the inner side of the second corner protection plate 112.

When the locking member 13 is in the locked state, the first locking block is inserted into the first locking slot, and the second locking block is inserted into the second locking slot, thereby ensuring the stability of the locking member 13 in the locked state.

Figure 6:
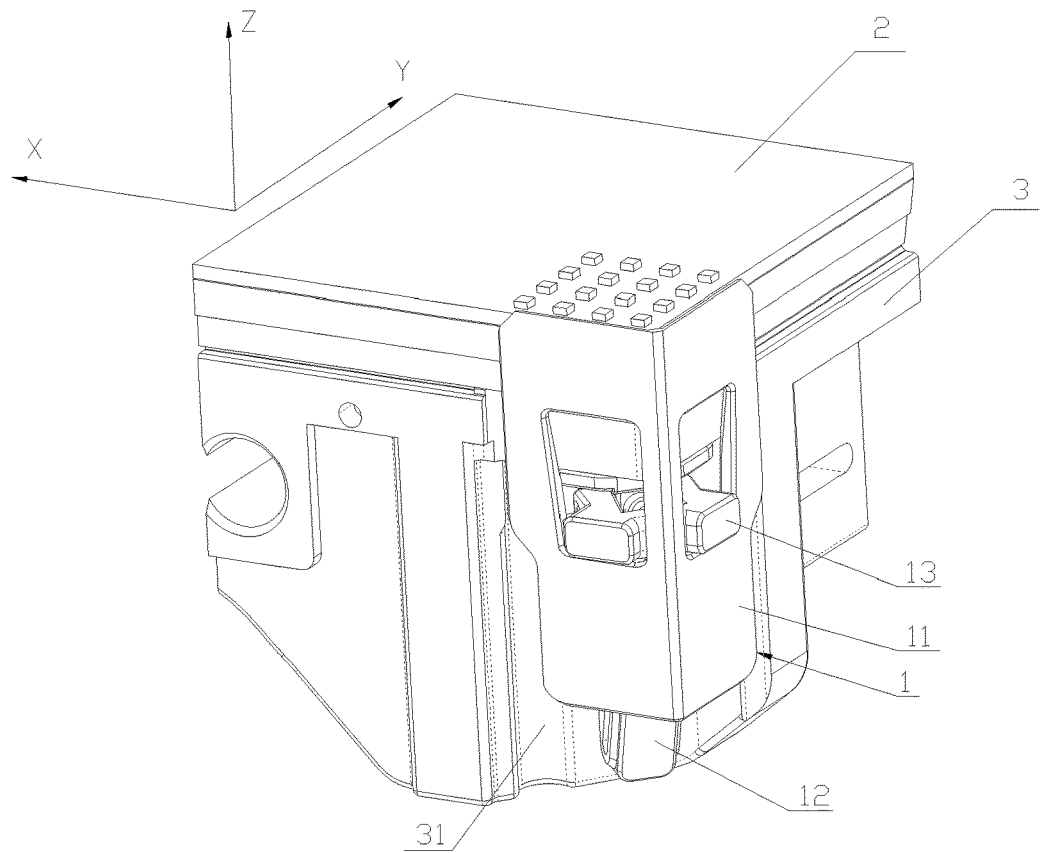
FIG. 6 is a structural diagram of a display screen assembly in accordance with an embodiment of the present disclosure.

As shown in FIG. 6, another embodiment of the present disclosure further provides a display screen assembly, including the display module 2, the frame 3, and the above-mentioned corner protection device 1. The display module 2 is mounted on the frame 3, and the base 12 is mounted at each corner of the frame 3. It can be understood that the display module 2 is mounted above the frame 3, and the base 12 (that is, one corner protection device 1) is mounted at each corner of the frame 3.

When the locking member 13 is in the locked state, the first corner protection plate 111 and the second corner protection plate 112 protrude from the two adjacent sides of the display module 2. It can be understood that when the locking block 133 is inserted into the locking slot 113, the locking member 13 is in the locked state. At this time, the first protrusion 131 passes through the first through hole 1111 to be exposed outside the first corner protection plate 111, and the second protrusion 132 passes through the second through hole 1121 to be exposed outside the second corner protection plate 112. The first corner protection plate 111 and the second corner protection plate 112 protrude from the two adjacent sides of the display module 2, so that the corner protector 11 can protect the corners of the display module 2, avoiding accidents that damage the corners of the display module 2 during the process of handling the display screen assembly.

When the locking member 13 is in the unlocked state, the first corner protection plate 111 and the second corner protection plate 112 are received in the frame 3. It can be understood that when two display modules are assembled, the first protrusion 131 of one display module is pushed by the first protrusion 131 of the other display module (or the second protrusion 132 of one display module is pushed by the second protrusion 132 of the other display module), enabling the locking member 13 to slide on the base 12 to the unlocked state; at the same time, the corner protector 11 slides on the base 12 until the first corner protection plate 111 and the second corner protection plate 112 move below the display module 2 (that is, the corner protector 11 is received in the corner of the frame 3).

In the present disclosure, the corner protection device 1 is installed at each corner of the display screen assembly, and the first corner protection plate 111 and the second corner protection plate 112 can protect the corners of the display module 2, avoiding accidents that damage the corners of the display module 2 during the transportation of the display screen assembly.

In an embodiment, as shown in FIG. 6, the corner of the frame 3 is provided with a receiving groove 31. When the locking member 13 is in the unlocked state, the corner protector 11 is located in the receiving groove 31. It can be understood that the second sliding hole 122 is obliquely defined in the base 12. When the locking member 13 begins to lock the corner protector 11, the corner protector 11 slides downwards obliquely along the second sliding hole 122 until the corner protector 11 is received in the receiving groove 31, such that the first corner protection plate 111 and the second corner protection plate 112 do not hinder the assembly of the two adjacent display modules.

In the present disclosure, as shown in FIG. 7, without applying any pushing force to the first protrusion 131 or the second protrusion 132, the pulling force from the second elastic member 15 drives the base 12 of the locking member 13 to slide until the locking block 133 is inserted into the locking slot 113, and the first protrusion 131 passes through the first through hole 1111 to be exposed outside the first corner protection plate 111, and the second protrusion 132 passes through the second through hole 1121 be exposed outside the second corner protection plate 112. At the same time, the pulling force from the first elastic member 14 drives the corner protector 11 to slide on the base 12 until the first corner protection plate 111 and the second corner protection plate 112 protrude from the two adjacent sides of the display module 2 of the display screen, and the first corner protection plate 111 and the second corner protection plate 112 protrude above the display module 2.

When two display screens are assembled, the first protrusion 131 of one display module is pushed by the first protrusion 131 of the other display module (or the second protrusion 132 of one display module is pushed by the second protrusion 132 of the other display module), the locking member 13 slides on the base 12 to be in the unlocked state. As the locking member 13 slides, the second elastic member 15 is elongated, and the corner protector 11 slides downwards on the base 12 due to the action of thrust, gravity, or external force until the corner protector is received in the corner of the frame 3. As the corner protector 11 slides on the base 12, the corner protector 11 elongates the first elastic member 14.

The above descriptions are only optional embodiments of the application, and do not limit the scope of the patents of the present application. All the equivalent structural transformations made by the content of the specification and drawings of the present application under the creative concept of the present application, or directly/indirectly used in other related technical fields are all comprised in the protection scope of the patents of the present application.

What is claimed is:

1. A corner protection device for a display screen, wherein the corner protection device comprises a corner protector, a base, and a locking member; the corner protector comprises a first corner protection plate and a second corner protection plate connected to the first corner protection plate, a first through hole is defined in the first corner protection plate, and a second through hole is defined in the second corner protection plate; a locking slot is formed in the corner protector, a first protrusion, a second protrusion, and a locking block are arranged on the locking member; the corner protector and the locking member are both slidably mounted on the base, and the locking member is configured to lock the corner protector on the base;

when the locking member slides on the base to be in a locked state, the locking block is inserted into the locking slot, the first protrusion is inserted into the first through hole, the second protrusion is inserted into the second through hole, and the first corner protection plate and the second corner protection plate protrude from a corner of the display screen;

when the locking member slides on the base to be in an unlocked state, the first protrusion or the second protrusion drives the locking block to disengage from the locking slot, and the first corner protection plate and the second corner protection plate are received in the corner of the display screen.

2. The corner protection device according to claim 1, further comprising a first elastic member connected between the corner protector and the base; when the locking member transitions from the unlocked state to the locked state, the first elastic member is configured to drive the locking member to slide on the base until the locking block is inserted into the locking slot.

3. The corner protection device according to claim 1, further comprising a second elastic member connected between the locking member and the base; the second elastic member is configured to drive the locking member to slide on the base, such that the locking member transitions from the unlocked state to the locked state.

4. The corner protection device according to claim 1, wherein a first sliding hole is defined in the base, a first sliding rod is arranged on the locking member, and the locking member is slidably mounted on the base through the first sliding rod which is inserted into the first sliding hole.

5. The corner protection device according to claim 4, wherein a second sliding hole is defined in the base, a second sliding rod is arranged on the corner protector, and the corner protector is slidably mounted on the base through the second sliding rod which is inserted into the second sliding hole.

6. The corner protection device according to claim 5, wherein the second sliding hole is an inclined through hole, and a center line of the first sliding hole and a center line of the second sliding hole form an acute angle.

7. The corner protection device according to claim 5, wherein a first mounting block is arranged on the first corner protection plate, a second mounting block is arranged the second corner protection plate, a sliding groove is formed between the first mounting block and the second mounting block, and the second sliding rod is arranged between the first mounting block and the second mounting block; the base is provided with a sliding portion, the second sliding hole is defined in the sliding portion, and the sliding portion is inserted into the sliding groove.

8. The corner protection device according to claim 1, wherein the locking slot comprises a first locking slot formed in the first corner protection plate and a second locking slot formed in the second corner protection plate; the locking block comprises a first locking block arranged on the first protrusion and a second locking block arranged on the second protrusion;

when the locking member is in the locked state, the first locking block is inserted into the first locking slot, and the second locking block is inserted into the second locking slot.

9. A display screen assembly, comprising a display module, a frame, and a corner protection device, wherein the corner protection device comprises a corner protector, a base, and a locking member; the corner protector comprises a first corner protection plate and a second corner protection plate connected to the first corner protection plate, a first through hole is defined in the first corner protection plate, and a second through hole is defined in the second corner protection plate; a locking slot is formed in the corner protector, a first protrusion, a second protrusion, and a locking block are arranged on the locking member; the corner protector and the locking member are both slidably mounted on the base, and the locking member is configured to lock the corner protector on the base;

when the locking member slides on the base to be in a locked state, the locking block is inserted into the locking slot, the first protrusion is inserted into the first through hole, the second protrusion is inserted into the second through hole, and the first corner protection plate and the second corner protection plate protrude from a corner of the display screen;

when the locking member slides on the base to be in an unlocked state, the first protrusion or the second protrusion drives the locking block to disengage from the locking slot, and the first corner protection plate and the second corner protection plate are received in the corner of the display screen;

the display module is mounted on the frame, and the base is mounted at each corner of the frame;

when the locking member is in the locked state, the first corner protection plate and the second corner protection plate protrude from two adjacent sides of the display module;

when the locking member is in the unlocked state, the first corner protection plate and the second corner protection plate are received in the frame.

10. The display screen assembly according to claim 9, wherein a receiving groove is formed in each corner of the frame, and the corner protector is located in the receiving groove when the locking member is in the unlocked state.

11. The display screen assembly according to claim 9, wherein the corner protection device further comprises a first elastic member connected between the corner protector and the base; when the locking member transitions from the unlocked state to the locked state, the first elastic member is configured to drive the locking member to slide on the base until the locking block is inserted into the locking slot.

12. The display screen assembly according to claim 9, further comprising a second elastic member connected between the locking member and the base; the second elastic member is configured to drive the locking member to slide on the base, such that the locking member transitions from the unlocked state to the locked state.

13. The display screen assembly according to claim 9, wherein a first sliding hole is defined in the base, a first sliding rod is arranged on the locking member, and the locking member is slidably mounted on the base through the first sliding rod which is inserted into the first sliding hole.

14. The display screen assembly according to claim 13, wherein a second sliding hole is defined in the base, a second sliding rod is arranged on the corner protector, and the corner protector is slidably mounted on the base through the second sliding rod which is inserted into the second sliding hole.

15. The display screen assembly according to claim 14, wherein the second sliding hole is an inclined through hole, and a center line of the first sliding hole and a center line of the second sliding hole form an acute angle.

16. The display screen assembly according to claim 14, wherein a first mounting block is arranged on the first corner protection plate, a second mounting block is arranged on the second corner protection plate, a sliding groove is formed between the first mounting block and the second mounting block, and the second sliding rod is arranged between the first mounting block and the second mounting block; a sliding portion is arranged on the base, the second sliding hole is defined in the sliding portion, and the sliding portion is inserted into the sliding groove.

17. The display screen assembly according to claim 9, wherein the locking slot comprises a first locking slot formed in the first corner protection plate and a second locking slot formed in the second corner protection plate; the locking block comprises a first locking block arranged on the first protrusion and a second locking block arranged on the second protrusion;

when the locking member is in the locked state, the first locking block is inserted into the first locking slot, and the second locking block is inserted into the second locking slot.

\* \* \* \* \*